United States Patent
Chan et al.

(10) Patent No.: US 8,357,603 B2
(45) Date of Patent: Jan. 22, 2013

(54) METAL GATE FILL AND METHOD OF MAKING

(75) Inventors: Bor-Wen Chan, Hsin-Chu (TW); Hsueh Wen Tsau, Zhunan Township, Miaoli County (TW); Kuang-Yuan Hsu, Fongyuan (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 425 days.

(21) Appl. No.: 12/641,560

(22) Filed: Dec. 18, 2009

(65) Prior Publication Data

US 2011/0151655 A1   Jun. 23, 2011

(51) Int. Cl.
   *H01L 21/4763* (2006.01)
(52) U.S. Cl. ........................................ 438/591
(58) Field of Classification Search .................. 438/591, 438/701
   See application file for complete search history.

(56) References Cited

U.S. PATENT DOCUMENTS

| | | | |
|---|---|---|---|
| 6,110,837 A | 8/2000 | Linliu et al. | |
| 6,218,244 B1 | 4/2001 | Chan et al. | |
| 6,232,175 B1 | 5/2001 | Liu et al. | |
| 6,291,312 B1 | 9/2001 | Chan et al. | |
| 6,352,919 B1 | 3/2002 | Tu et al. | |
| 6,399,286 B1 | 6/2002 | Liu et al. | |
| 6,440,875 B1 | 8/2002 | Chan et al. | |
| 6,503,848 B1 | 1/2003 | Chan et al. | |
| 6,656,796 B2 | 12/2003 | Chan et al. | |
| 6,664,592 B2 * | 12/2003 | Inumiya et al. | 257/330 |
| 6,706,591 B1 | 3/2004 | Chan et al. | |
| 6,713,398 B2 | 3/2004 | Chan | |
| 6,764,903 B1 | 7/2004 | Chan et al. | |
| 6,812,044 B2 | 11/2004 | Chiu et al. | |
| 6,828,237 B1 | 12/2004 | Chan et al. | |

(Continued)

FOREIGN PATENT DOCUMENTS

JP   2002198521   7/2002

OTHER PUBLICATIONS

S. Nakamura, R. Suzuki, M. Fukuda, M. Kobayashi, and A. Hatada, Aluminum Word Line and Bit Line Fabrication Technology for COB DRAM Using a Polysilicon-Aluminum Substitute, Symposium on VSLI Technology Digest of Technical Papers, 1999, pp. 35-36, 4A-2, Fujitsu Laboratories, Ltd., Morinosato-Wakamiya 10-1, Atugi 243-0197, Japan.

(Continued)

*Primary Examiner* — Bradley K Smith
(74) *Attorney, Agent, or Firm* — Haynes and Boone, LLP

(57) ABSTRACT

The present disclosure provides various methods of fabricating a semiconductor device. A method of fabricating a semiconductor device includes providing a semiconductor substrate and forming a gate structure over the substrate. The gate structure includes a first spacer and a second spacer formed apart from the first spacer. The gate structure also includes a dummy gate formed between the first and second spacers. The method also includes removing a portion of the dummy gate from the gate structure thereby forming a partial trench. Additionally, the method includes removing a portion of the first spacer and a portion of the second spacer adjacent the partial trench thereby forming a widened portion of the partial trench. In addition, the method includes removing a remaining portion of the dummy gate from the gate structure thereby forming a full trench. A high k film and a metal gate are formed in the full trench.

20 Claims, 15 Drawing Sheets

U.S. PATENT DOCUMENTS

| | | | |
|---|---|---|---|
| 7,023,042 | B2 | 4/2006 | Chan et al. |
| 7,067,391 | B2 | 6/2006 | Chan et al. |
| 7,081,413 | B2 | 7/2006 | Chan et al. |
| 7,122,484 | B2 | 10/2006 | Perng et al. |
| 7,172,933 | B2 | 2/2007 | Huang et al. |
| 7,195,969 | B2 | 3/2007 | Chan et al. |
| 7,202,172 | B2 | 4/2007 | Chan et al. |
| 7,241,674 | B2 | 7/2007 | Chan et al. |
| 7,354,847 | B2 | 4/2008 | Chan et al. |
| 7,671,232 | B2 | 3/2010 | Du et al. |
| 7,838,802 | B2 | 11/2010 | Wen et al. |
| 8,008,143 | B2 | 8/2011 | Hsu et al. |
| 8,043,599 | B2 | 10/2011 | Du et al. |
| 8,048,810 | B2 | 11/2011 | Tsai et al. |
| 8,093,117 | B2 | 1/2012 | Tsau et al. |
| 8,173,540 | B2 | 5/2012 | Lee et al. |
| 8,193,081 | B2 | 6/2012 | Lim et al. |
| 2002/0068460 | A1 | 6/2002 | Chan |
| 2004/0214448 | A1 | 10/2004 | Chan et al. |
| 2004/0266115 | A1 | 12/2004 | Chan et al. |
| 2005/0282350 | A1 | 12/2005 | Chou et al. |
| 2006/0040481 | A1 | 2/2006 | Chan et al. |
| 2007/0222000 | A1 | 9/2007 | Chan et al. |
| 2007/0296052 | A1 | 12/2007 | Lee et al. |
| 2008/0265322 | A1 | 10/2008 | Lin et al. |
| 2010/0044783 | A1* | 2/2010 | Chuang et al. ................ 257/328 |
| 2011/0031538 | A1 | 2/2011 | Hsieh et al. |
| 2011/0081774 | A1 | 4/2011 | Yeh et al. |
| 2011/0143529 | A1 | 6/2011 | Lee et al. |
| 2011/0147858 | A1 | 6/2011 | Lim et al. |
| 2011/0151655 | A1 | 6/2011 | Chan et al. |
| 2011/0183508 | A1 | 7/2011 | Chan et al. |
| 2011/0193180 | A1 | 8/2011 | Chen et al. |
| 2011/0241130 | A1 | 10/2011 | Chan et al. |
| 2011/0256682 | A1 | 10/2011 | Yu et al. |
| 2011/0256731 | A1 | 10/2011 | Lee et al. |
| 2011/0306196 | A1 | 12/2011 | Hsu et al. |
| 2012/0001266 | A1 | 1/2012 | Lim et al. |
| 2012/0049247 | A1 | 3/2012 | Lee et al. |
| 2012/0094475 | A1 | 4/2012 | Tsau |

OTHER PUBLICATIONS

Chinese Patent Office, Office Action dated Feb. 29, 2012, Application No. 201010202875.1, 6 pages.

* cited by examiner

US 8,357,603 B2

METAL GATE FILL AND METHOD OF MAKING

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. However, problems arise when integrating a high-k/metal gate feature in a CMOS process flow due to various factors such as the gate trench width used in replaced polysilicon gate (RPG), Lg ~25.5 nm, devices is very narrow (e.g., <10 nm for N-MOS and <2 nm for P-MOS). Such a narrow trench may include a bridging across an upper portion of the trench. In other words, the space for wetting the gate metal fill (e.g., Al-fill) is very narrow. Accordingly, the bridging may cause the metal gate fill metal to have voids after being filled into the trench.

Accordingly, an improved metal gate fill and method of making is desired.

SUMMARY

In an embodiment, a method of fabricating a semiconductor device includes providing a semiconductor substrate and forming a gate structure over the substrate. The gate structure includes a first spacer and a second spacer formed apart from the first spacer. The gate structure also includes a dummy gate formed between the first and second spacers. The method also includes removing a portion of the dummy gate from the gate structure thereby forming a partial trench. Additionally, the method includes removing a portion of the first spacer and a portion of the second spacer adjacent the partial trench thereby forming a widened portion of the partial trench. In addition, the method includes removing a remaining portion of the dummy gate from the gate structure thereby forming a full trench. A high k film and a metal gate are then formed in the full trench.

In another embodiment, a method of fabricating a semiconductor device includes providing a semiconductor substrate and forming an insulator over the substrate. The method also includes forming a first spacer over the insulator, forming a second spacer apart from the first spacer over the insulator and forming, a dummy gate between the first and second spacers. The method further includes removing a portion of the first spacer and a portion of the second spacer thereby forming a widened area between a portion of the first and second spacers. In addition, the method includes removing the dummy gate thereby forming a trench and forming a metal gate in the trench.

In yet another embodiment, a method of fabricating a semiconductor device includes providing a substrate having a first region and a second region. The method also includes forming a first gate structure over the first region and a second gate structure over the second region. The first gate structure includes a first spacer, a second spacer, and a first dummy gate. The second gate structure includes a third spacer, a fourth spacer, and a second dummy gate. The method further includes removing a portion of the first dummy gate from the first gate structure thereby forming a first partial trench. Additionally, the method includes removing a portion of the second dummy gate from the second gate structure thereby forming a second partial trench. Furthermore, the method includes removing a portion of the first and second spacers thereby forming a widened portion of the first partial trench and removing a portion of the third and fourth spacers thereby forming a widened portion of the second partial trench. In addition, the method includes removing remaining portions of the first and second dummy gates thereby forming first and second full trenches. Accordingly, the method includes forming a high k film in the first and second full trenches, and forming metal gates in the first and second full trenches.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In addition, the present disclosure provides examples of a "gate last" metal gate process, however one skilled in the art may recognize applicability to other processes and/or use of other materials.

Figure 1:
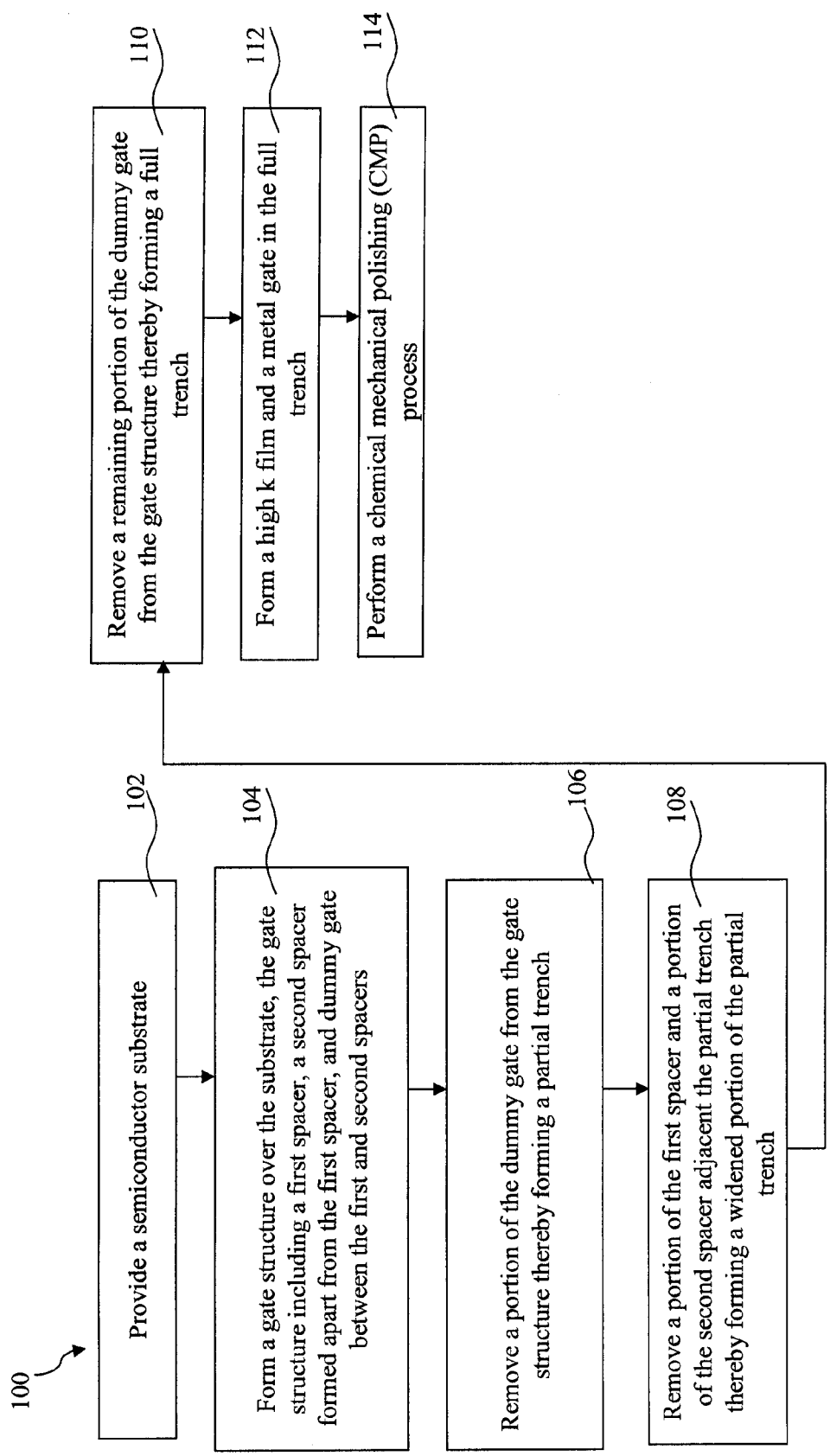
FIG. 1 is a flowchart illustrating a method for fabricating a semiconductor device with a metal gate according to various aspects of the present disclosure.

Referring to FIG. 1, illustrated is a flowchart of a method 100 for fabricating a semiconductor device with metal gates according to various aspects of the present disclosure. Referring also to FIGS. 2A to 2F, illustrated are cross-sectional views of a semiconductor device 200 at various stages of fabrication according to the method 100 of FIG. 1. It should be noted that part of the semiconductor device 200 may be fabricated with a CMOS process flow. Accordingly, it is understood that additional processes may be provided before, during, and after the method 100 of FIG. 1, and that some other processes may only be briefly described herein. The semiconductor device 200 may be fabricated in a gate last process (also referred to as a replacement poly gate process (RPG)). In a gate last process, a dummy dielectric and dummy poly gate structure may be initially formed and may be followed by a normal CMOS process flow until deposition of an interlayer dielectric (ILD). The dummy dielectric and dummy poly gate structure may then be removed and replaced with a high-k gate dielectric/metal gate structure. The semiconductor device 200 is similar to the semiconductor device 400 of FIGS. 4A-4G. Accordingly, similar features in FIGS. 2 and 4 are numbered the same for the sake of simplicity and clarity.

Figure 2A:
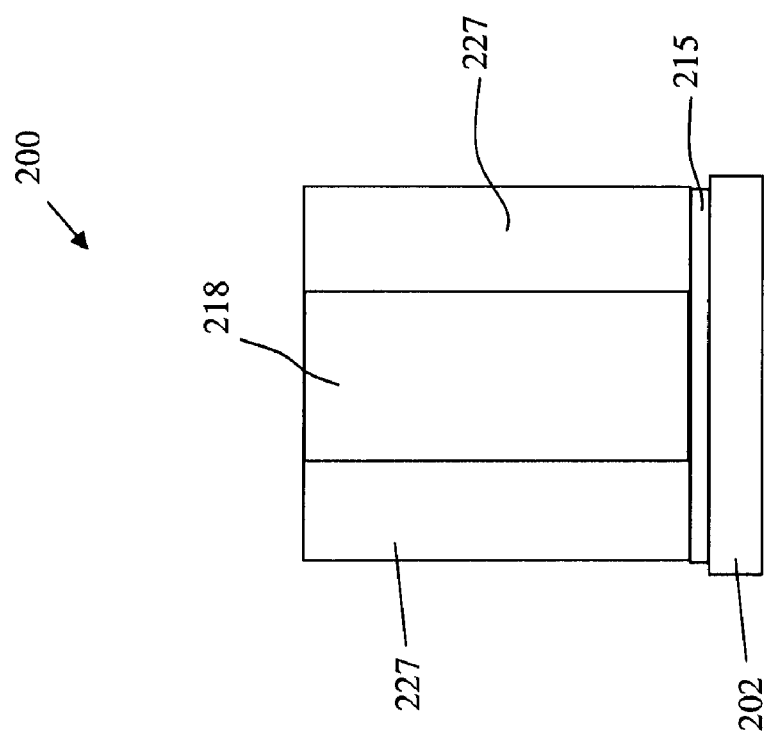
FIGS. 2A to 2F are cross-sectional views of a semiconductor device at various stages of fabrication according to the method of FIG. 1.

The method 100 begins with block 102 in which a semiconductor substrate is provided. In FIG. 2A, the semiconductor device 200 may include a semiconductor substrate 202 such as a silicon substrate. The substrate 202 may alternatively include silicon germanium, gallium arsenic, or other suitable semiconductor materials. The substrate 202 may further include doped regions such as a P-well and/or an N-well (not shown). The substrate 202 may further include other features such as a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure. The substrate 202 may further include doped regions such as a P-well and N-well (not shown). The active region may be configured as an NMOS device (e.g., nFET) or a PMOS device (e.g., pFET).

The method 100 continues with block 104 in which a gate structure is formed over the substrate 202, the gate structure includes spacers 227 and a dummy polysilicon (or poly) layer/gate 218. The formation of the gate structures includes forming various material layers, and etching/patterning the various material layers to form a gate structure. The semiconductor device 200 may include a dummy insulator layer 215 formed over the substrate 202. In the alternative, an insulator layer including an interfacial layer, a high k dielectric layer and/or a barrier layer may be formed on the substrate 202 and left in the final device. These various layers are described in more detail below with reference to FIG. 4A. The insulator layer 215 may be a dummy dielectric layer formed on the substrate 202. The dummy dielectric layer may include an oxide (e.g., thermal or chemical oxide formation). The dummy dielectric layer may include a thickness ranging from 10 to about 50 angstrom (A).

The semiconductor device 200 also includes a dummy polysilicon (or poly) layer 218 formed over the insulator layer 215 by a suitable deposition process. For example, silane ($SiH_4$), di-silane ($Si_2H_6$), or di-clorsilane ($SiCl_2H_4$) may be used as a chemical gas in a CVD process to form the poly layer 218. The poly layer 218 may include a thickness ranging from about 400 to about 2000 angstrom (A). Alternatively, an amorphous silicon layer may optionally be formed instead of the polysilicon layer. The semiconductor device 200 may further include a hard mask layer (not shown) formed on the poly layer 218. The hard mask layer may include silicon oxide, silicon nitride, silicon oxynitride, silicon carbide, and/or other suitable dielectric materials, and may be formed using a method such as CVD or PVD. The hard mask layer may include a thickness ranging from about 100 to about 400 angstrom (A). Additionally, an antireflective coating layer or bottom antireflective coating (BARC) layer may be used to enhance a photolithography process for patterning a photoresist layer. For example, a patterned photoresist layer (not shown) may be formed on the hard mask layer including a gate pattern. The gate patterns may be used to pattern the hard mask layer by a dry etch or wet etch process. The patterned hard mask may then be used to form the gate structure by a dry etch, wet etch, or combination dry and wet etch process. Accordingly, the gate structure may include the insulator layer 215, the dummy poly gate 218, and a hard mask (not shown).

Figure 4A:
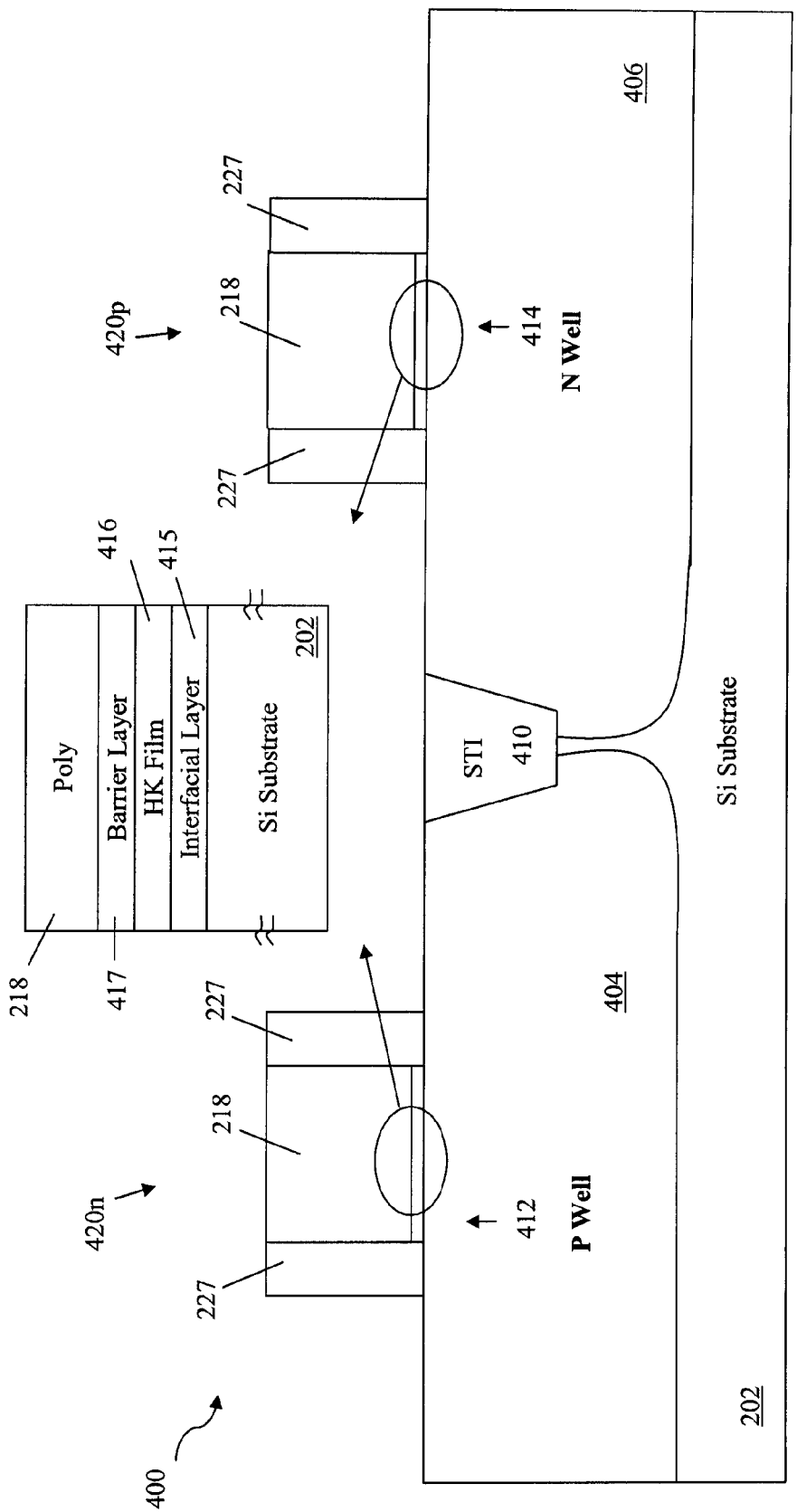
FIGS. 4A to 4G are cross-sectional views of a semiconductor device at various stages of fabrication according to the method of FIG. 3.
Figure 4B:
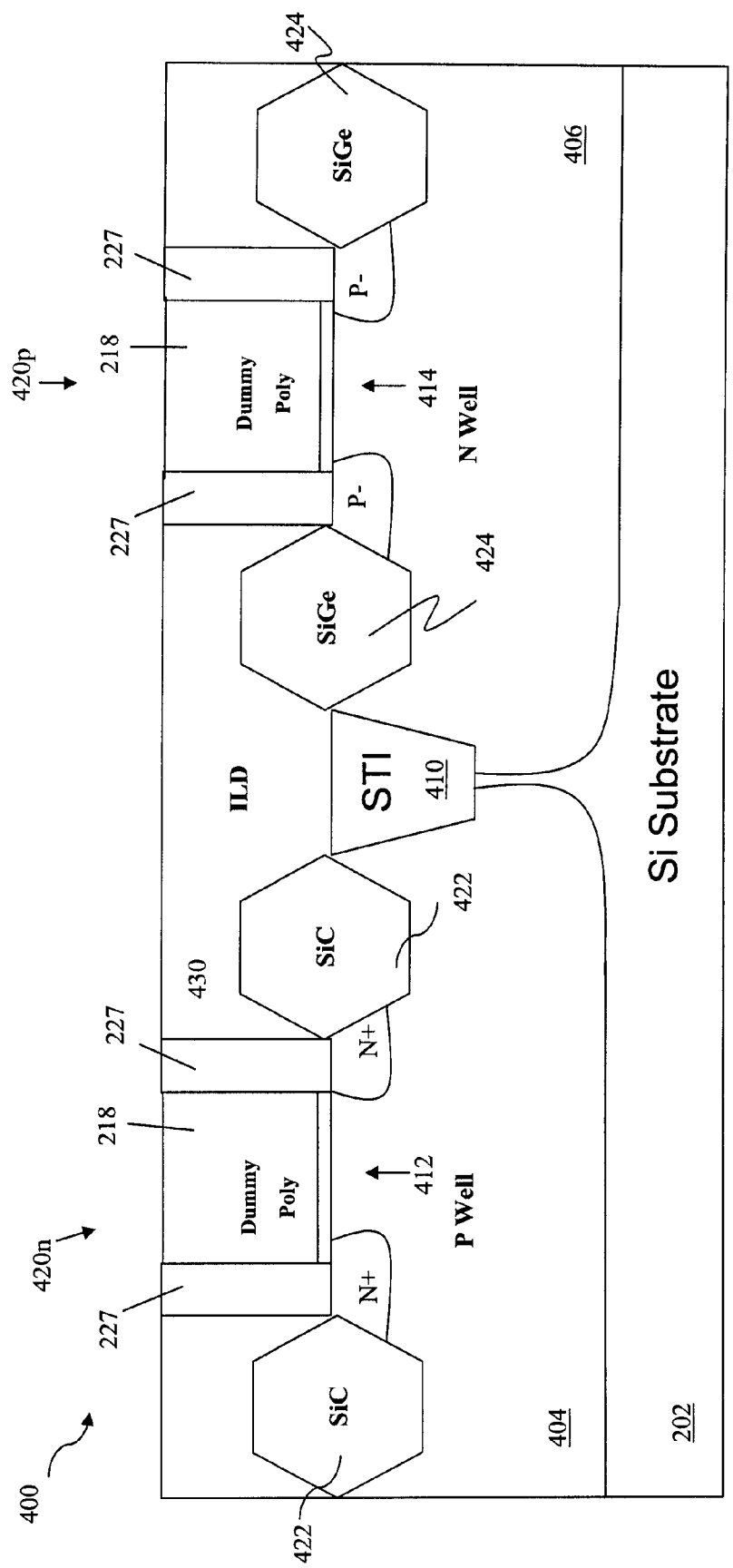

After formation of the gate structure (e.g., gate etching or patterning), it is understood that the semiconductor device 200 may undergo additional processing (e.g., CMOS processing) to form various features as described in more detail below with respect to FIG. 4B. A chemical mechanical polishing (CMP) process may be performed on the device 200 to planarize the device.

Figure 2B:
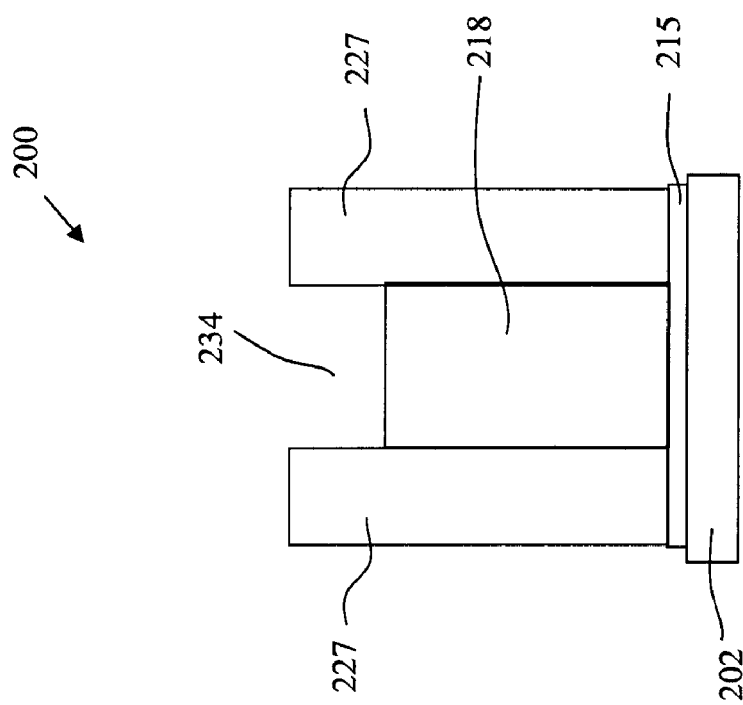

The method 100 continues with block 106 in which a portion of the dummy gates is removed from the gate structure thereby forming a partial trench in the gate structure. In FIG. 2B, a patterned photoresist layer (not shown) may be formed on the device 200 to protect a portion of the device 200. The patterned photoresist layer may be formed by photolithography, immersion lithography, ion-beam writing, or other suitable techniques. For example, the photolithography process may include spin-coating, soft-baking, exposure, post-baking, developing, rinsing, drying, and other suitable process. A partial amount of the dummy poly gates 218 in the gate structure may be removed by a dry etching, wet etching, or combination dry and wet etching process. For example, a wet etching process may include exposure to a hydroxide containing solution (e.g., ammonium hydroxide), de-ionized water, and/or other suitable etchant solutions. Etching the poly layer 218 may be performed using HBr, CF4, C12, O2 or HeO2 at a temperature of about 0° C.-100° C. The etching process may be stopped after a time period so that a portion (e.g., ~400 angstroms) of the dummy poly gates 218 remains. Any suitable process may be used to stop the etch process. Accordingly, a portion of the dummy poly gate 218 may be etched away, thereby forming a partial trench 234 in the gate structure. Any applied patterned photoresist layer (not shown) may be removed by stripping or other suitable process.

Figure 2C:
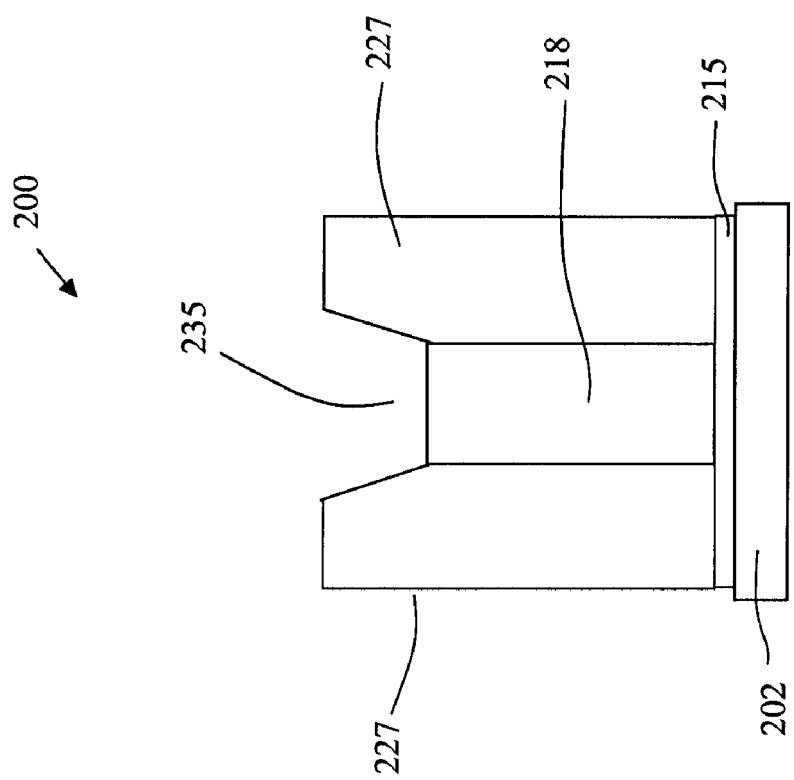

The method 100 continues with block 108 in which a portion of the spacers 227 is removed thereby forming a widened portion 235 of the partial trenches. In an embodiment, the portions of the spacers 227 are removed using a dry argon sputtering to form a funnel-shape in the trenches 235. The molecular size of the argon is appropriate for making the funnel-shape. However other elements or other etching/forming methods may produce acceptable results. As shown in FIG. 2C, the argon sputtering may produce a somewhat angled side edge on the spacers 227, causing the trench to have a funnel-shaped profile. In an embodiment, this angle may extend downward approximately 100 angstroms and inward to the trench 235. In an embodiment, the remaining gate height may be approximately 400 angstroms and the gate width may be approximately 22-27 nm. However, it is contemplated that other shapes and sizes may be formed in the spacers 227 during the argon sputtering. It is to be understood that these methods may be performed on metal gate devices having a replaced polysilicon gate (RPG) using a high k last process. Additionally, other methods, such as wet etching, may be used with this system. In an embodiment, only the uppermost portion of the spacers 227 are etched, thus leaving the lower portion of the spacers intact for the device 200. The widened portion of the spacers 227 may be removed using a chemical-mechanical polishing (CMP) process, as described in more detail below. Accordingly, the enlarged trench 235 allows for better filling for the metal gate, such as in spin-on Al.

In an embodiment, this process may be performed in a single etcher PVD tool. The argon sputtering may be performed using an argon gas pressure of approximately 3-20 mTorr and at a flow rate of approximately 300-600 sccm. The argon sputtering may have a bias of approximately 200-500 Watts. In an embodiment, the argon sputtering may be performed at a temperature of approximately 0° C.-100° C. The argon sputtering may be performed for approximately 5-30 seconds.

Figure 2D:
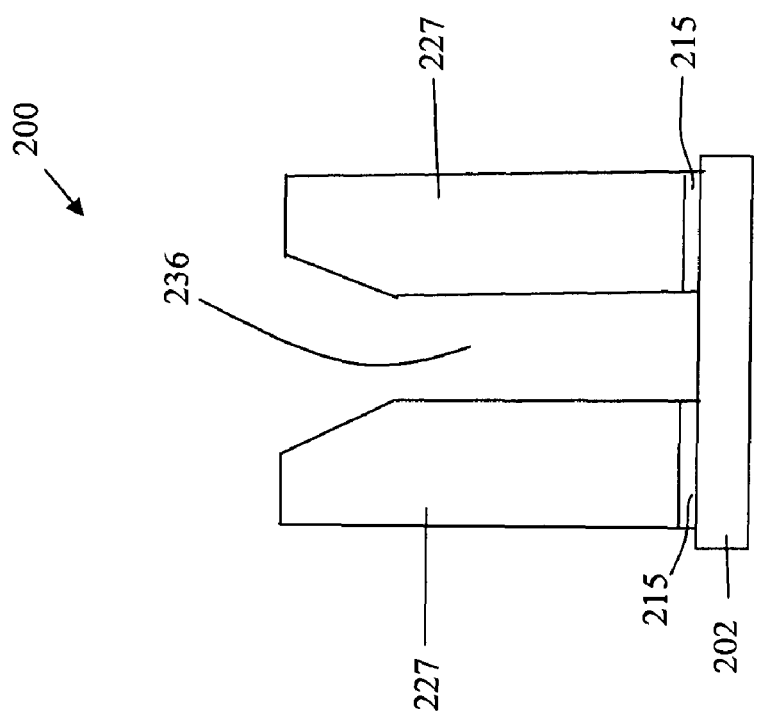

The method 100 continues with block 110 in which a remaining portion of the dummy gate is removed from the gate structure thereby forming a full trench in the gate structure. In FIG. 2D, a patterned photoresist layer (not shown) may be formed on the device 200 to protect a portion of the device 200. The patterned photoresist layer may be formed by photolithography, immersion lithography, ion-beam writing, or other suitable techniques. For example, the photolithography process may include spin-coating, soft-baking, exposure, post-baking, developing, rinsing, drying, and other suitable process. The remaining portion of the dummy poly gates 218 in the gate structures may be removed by a dry etching, wet etching, or combination dry and wet etching process thereby forming a full trench 236. For example, a wet etching process may include exposure to a hydroxide containing solution (e.g., ammonium hydroxide), de-ionized water, and/or other suitable etchant solutions. Etching the poly layer 218 may be performed using HBr, CF4, C12, O2 or HeO2 at a temperature of about 0° C.-100° C. Accordingly, the remaining portion of the dummy poly gate 218 may be etched away down to the insulator 215, thereby forming full trenches 236 in the gate structures. Any applied patterned photoresist layer (not shown) may be removed by stripping or other suitable process.

The dummy poly gate 218 and dummy dielectrics 215 may be removed in a single-step etching process or multiple-step etching process. For example, a first wet etch process may be used to remove the dummy poly gate 218. The first wet etch process may include exposure to a hydroxide containing solution (e.g., ammonium hydroxide), deionized water, and/or other suitable etchant solutions. A second wet etch process may be used to remove the dummy dielectric 215. The second wet etch process may include exposure to a buffered HF solution or a buffered oxide etchant (BOE). The second wet etch process may selectively remove the dummy dielectric 215 and may stop at the substrate 202, thereby forming the full trench 236 in the gate structure. It is understood that other etching chemicals may be used for selectively removing the dummy dielectric and dummy poly gate.

Figure 2E:
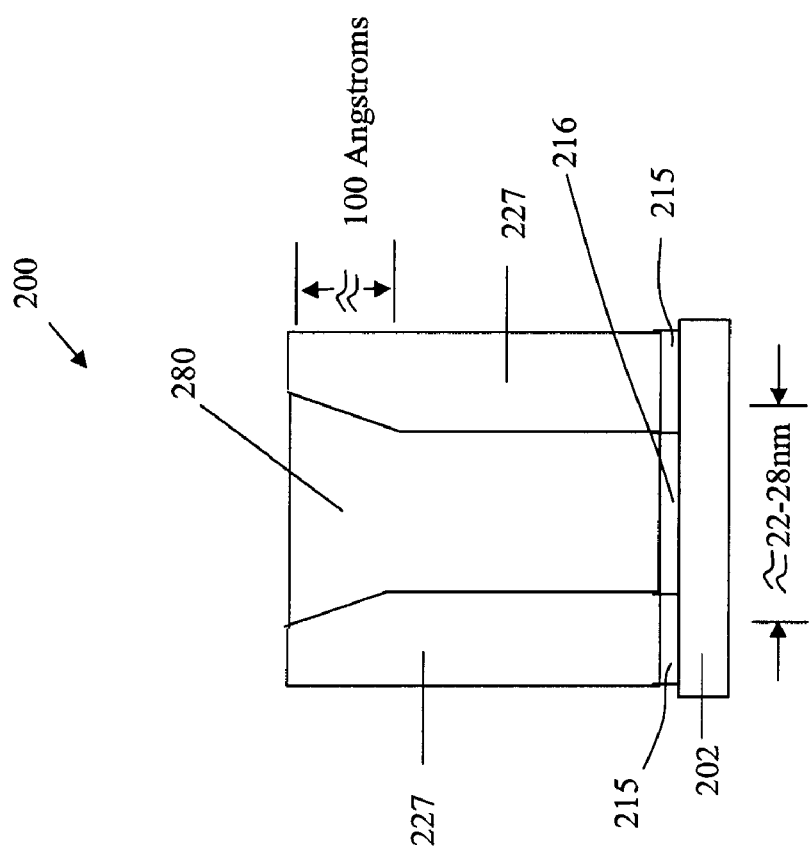

The method 100 continues with block 112 in which a high k gate film and a metal gate layer is formed to substantially fill in the trench. In FIG. 2E, a high k material layer or layers 216 (if not already formed on the substrate 202) may be formed on the substrate 202. The high k layers may include an interfacial layer, a high-k dielectric layer, and/or a barrier layer. These layers may be similar to the layers described in more detail below with respect to FIG. 4A. Additionally, a fill metal 280 may be deposited to fill in the trenches 236. In the present embodiment, a layer of titanium (Ti) may be deposited to function as a wetting layer for a subsequent aluminum (Al) fill. The Ti layer may be formed by PVD or other suitable process. A layer of Al 280 may be formed to fill in the trenches 236. The Al layer 280 may be formed by forming a first Al layer by CVD and then forming a second Al layer by PVD. Alternatively, the fill metal 280 may optionally include tungsten (W), copper (Cu), or other suitable metal material.

Figure 2F:
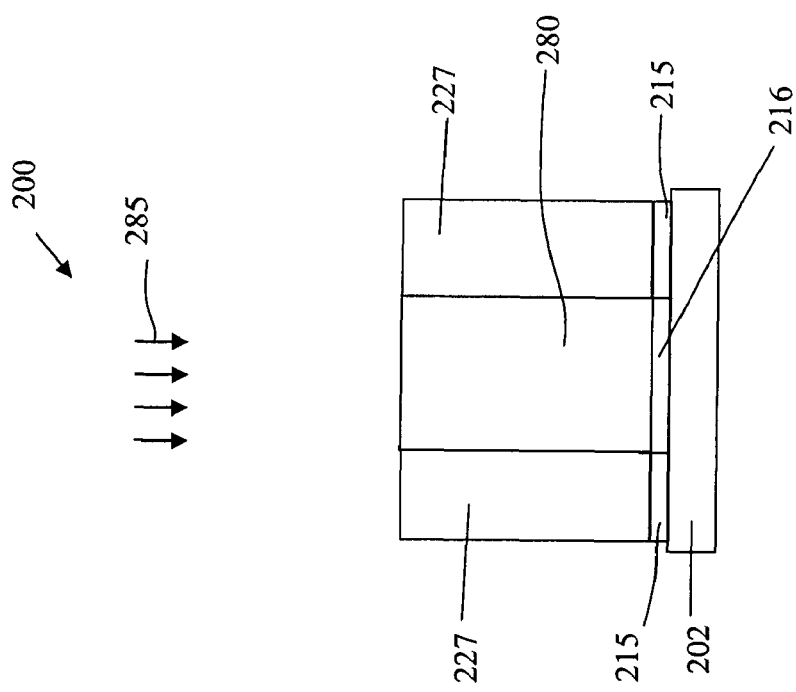

The method 100 continues with block 114 in which a chemical mechanical polishing (CMP) process is performed. In FIG. 2F, a CMP 285 may be performed on the Al layer 280 to remove the excess Al (e.g., the Al outside of the trenches 236). The CMP 285 may have a high selectivity to provide a substantially planar surface for the gate structure. Accordingly, the metal gate may perform the proper work function. Thus, the desired threshold voltages of the FET device may be achieved without added complexity. It should be noted that various metal layers and any SOG layer outside of the trenches may be removed by a combination CMP and etching process. Further, the quality and integrity of the high-k dielectric layer is maintained since it experiences a lower thermal cycle when formed in a gate last approach. It is understood that the semiconductor device 200 may undergo further processing to form various features such as contacts/vias, interconnect metal layers, interlayer dielectric, passivation layers, etc. It should be noted that the techniques and processes, such as lithography, etching, and high-k/metal gate formation, disclosed above with reference to FIGS. 1 and 2A-2F can also be implemented in the various embodiments disclosed below with reference to FIGS. 3 and 4A-4G.

Figure 3:
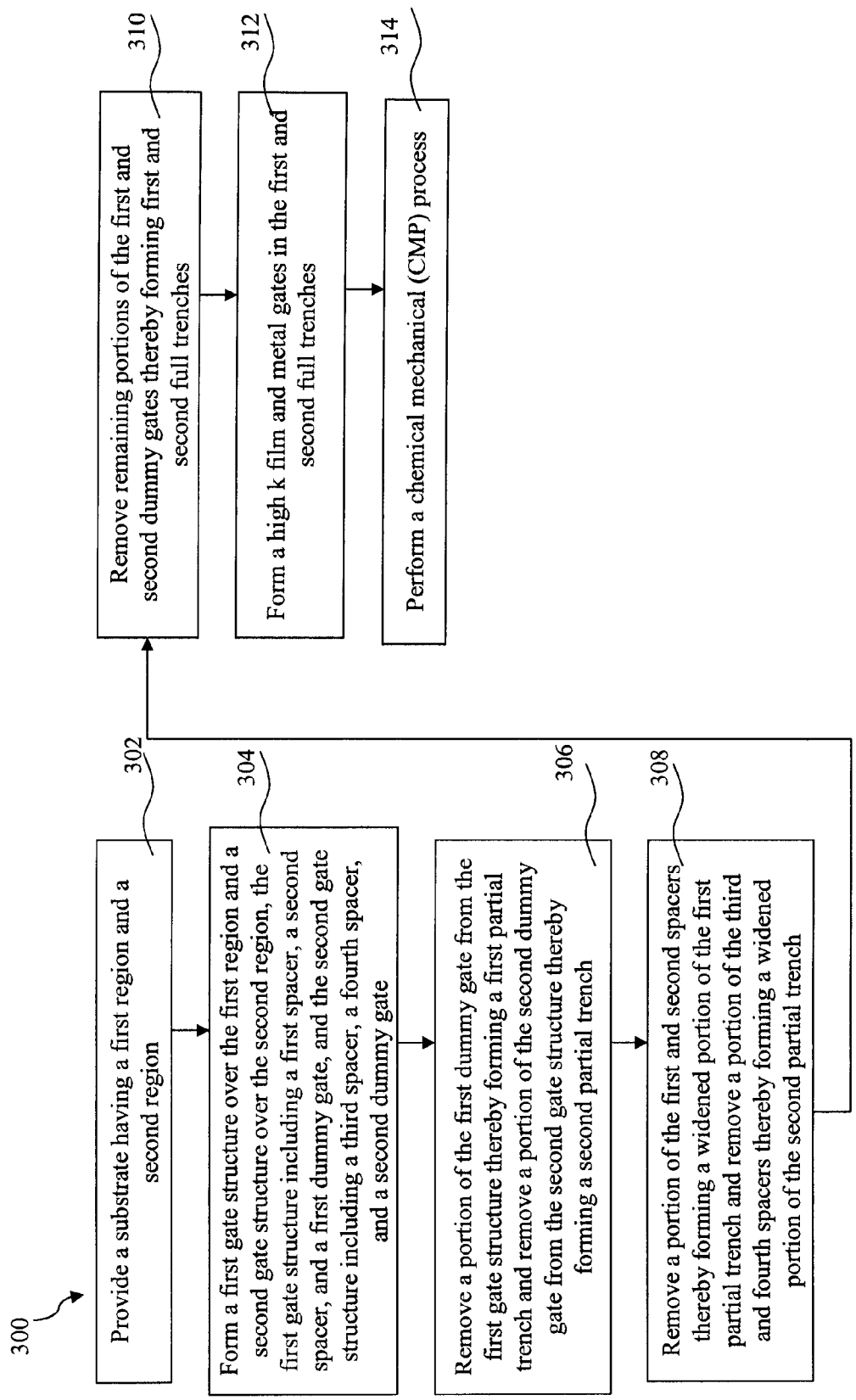
FIG. 3 is a flowchart illustrating a method for fabricating a semiconductor device having metal gates according to various aspects of the present disclosure.

Referring to FIG. 3, illustrated is a flowchart of a method 300 for fabricating a semiconductor device with metal gates according to various aspects of the present disclosure. Referring also to FIGS. 4A to 4G, illustrated are cross-sectional views of a semiconductor device 400 at various stages of fabrication according to the method 300 of FIG. 3. It should be noted that part of the semiconductor device 400 may be fabricated with a CMOS process flow. Accordingly, it is understood that additional processes may be provided before, during, and after the method 300 of FIG. 3, and that some other processes may only be briefly described herein. The semiconductor device 400 may be fabricated in a gate last process. The semiconductor device 400 is similar to the semiconductor device 200 of FIG. 2. Accordingly, similar features in FIGS. 2 and 4 are numbered the same for the sake of simplicity and clarity.

The method 300 begins with block 302 in which a semiconductor substrate is provided, the substrate having a first region and a second region. In FIG. 4A, the semiconductor device 400 may include a semiconductor substrate 202 such as a silicon substrate. The substrate 202 may further include doped regions such as a P-well 404 and N-well 406. The semiconductor device 400 may further include an isolation structure 410 such as a shallow trench isolation (STI) or LOCOS feature formed in the substrate 202 for isolating active regions 412 and 414 of the substrate 202. The active region 412 may be configured for an NMOS device (e.g., nFET) and the active region 414 may be configured for a PMOS device (e.g., pFET).

The method 300 continues with block 304 in which a first gate structure is formed over the first region and a second gate structure is formed over the second region, the first gate structure includes spacers 227 and a dummy polysilicon (or poly) layer/gate 218. The second gate structure includes spacers 227 and a dummy gate 218. The formation of the gate structures includes forming various material layers, and etching/patterning the various material layers to form a gate structure in the nFET 412 device side and a gate structure in the pFET 414 device side as discussed below.

The semiconductor device 400 may include an interfacial layer 415 formed over the substrate 202. The interfacial layer 415 may include a silicon oxide ($SiO_2$) layer (e.g., thermal or chemical oxide formation) having a thickness ranging from about 5 to about 20 angstrom (A). Alternatively, the interfacial layer 415 may optionally include HfSiO or SiON formed by atomic layer deposition (ALD), chemical vapor deposition (CVD), physical vapor deposition (PVD), thermal oxidation, or combinations thereof. In some embodiments, an Hf film may be formed on a thermal oxide by ALD, CVD, or PVD, and then oxidized by thermal $O_2$ to form HfSiO. In other embodiments, an Hf film may be formed by ALD, CVD, or PVD in a reactive $O_2$ ambient.

The semiconductor device 400 may further include a high-k dielectric layer 416 formed on the interfacial layer 415. The high-k dielectric layer 416 may be formed by ALD, CVD, metalorganic CVD (MOCVD), PVD, thermal oxidation, combinations thereof, or other suitable techniques. The high-k dielectric layer 416 may include a thickness ranging from about 5 to about 20 angstrom (A). The high-k dielectric layer 416 may include a binary or ternary high-k film such as $HfO_x$. Alternatively, the high-k dielectric layer 416 may optionally include other high-k dielectrics such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides, or other suitable materials. A post high-k deposition anneal may be performed in some embodiments.

The semiconductor device 400 may further include a barrier layer 417 formed over the high-k dielectric layer 416. The barrier layer 417 may include a metal film such as TiN or TaN. Alternatively, the barrier layer 417 may optionally include $Si_3N_4$. The barrier layer 417 may include a thickness ranging from about 5 to about 20 angstrom (A). The barrier layer 417 may function as a barrier between the high-k dielectric layer 416 and a subsequent dummy poly gate structure. The barrier layer 417 may help reduce or eliminate the risk of Fermi level pinning between the poly and the high-k dielectric 416 during subsequent processing. Also, the barrier layer 417 may function as a etch stop layer and protection layer during removal of the dummy poly gate as discussed later below. The barrier layer 417 may be formed by various deposition techniques such as ALD, PVD, CVD, or other suitable technique. It should be noted that the interfacial layer 415, high-k dielectric 416, and barrier layer 417 may be alternatively formed in a gate last process as was discussed in FIGS. 1 and 2.

The semiconductor device 400 may further include a polysilicon (or poly) layer 218 formed over the barrier layer 417 by a suitable deposition process. For example, silane ($SiH_4$), di-silane ($Si_2H_6$), or di-clorsilane ($SiCl_2H_4$) may be used as a chemical gas in a CVD process to form the poly layer 218. The poly layer 218 may include a thickness ranging from about 400 to about 2000 angstrom (A). Alternatively, an amorphous silicon layer may optionally be formed instead of the polysilicon layer. The semiconductor device 400 may further include a hard mask layer (not shown) formed on the poly layer 218. The hard mask layer may include silicon oxide, silicon nitride, silicon oxynitride, silicon carbide, and/or other suitable dielectric materials, and may be formed using a method such as CVD or PVD. The hard mask layer may include a thickness ranging from about 100 to about 400 angstrom (A). Additionally, an antireflective coating layer or bottom antireflective coating (BARC) layer may be used to enhance a photolithography process for patterning a photoresist layer. For example, a patterned photoresist layer (not shown) may be formed on the hard mask layer including a gate pattern overlying the nFET 412 device side and a gate pattern overlying the pFET 414 device side. The gate patterns may be used to pattern the hard mask layer by a dry etch or wet etch process.

The patterned hard mask may then be used to form the gate structure 420n in the nFET 412 device side and a gate structure 420p in the pFET 414 device side by a dry etch, wet etch, or combination dry and wet etch process. Accordingly, the gate structures 420n, 420p may each include an interfacial layer 415, high-k dielectric layer 416, a barrier layer 417, a dummy poly gate 218, and/or a hard mask.

After formation of the gate structures 420n, 420p (e.g., gate etching or patterning), it is understood that the semiconductor device 400 may undergo additional CMOS processing to form various features of the nFET 412 and pFET 414. Accordingly, the various features are only briefly discussed herein. In FIG. 4B, the various features may include SiC features 422 in the nFET 412 side, SiGe 424 features in the pFET 414 side, lightly doped source/drain regions (n-type and p-type LDD regions), sidewall or gate spacers 227, source/drain (S/D) regions (n-type and p-type S/D regions), silicide features, contact etch stop layer (CESL), and an interlayer dielectric (ILD) 430. It should be noted that the SiC features 422 and SiGe features 424 are optional, and that a strained layer may be implemented for the nFET 412 device and/or the pFET 414 device to boost the performance of the device. The ILD 430 may include an oxide formed by a high aspect ratio process (HARP) and/or high density plasma (HDP) CVD process. The deposition of the ILD 430 fills in the gaps between the adjacent gate structures 420n, 420p of the nFET 412 and pFET 414 devices, respectively. Thereafter, a chemical mechanical polishing (CMP) process may be performed on the ILD 430 to planarize the ILD 430 until the dummy poly gates 218 are exposed in the nFET 412 side and pFET 414 side, respectively.

Figure 4C:
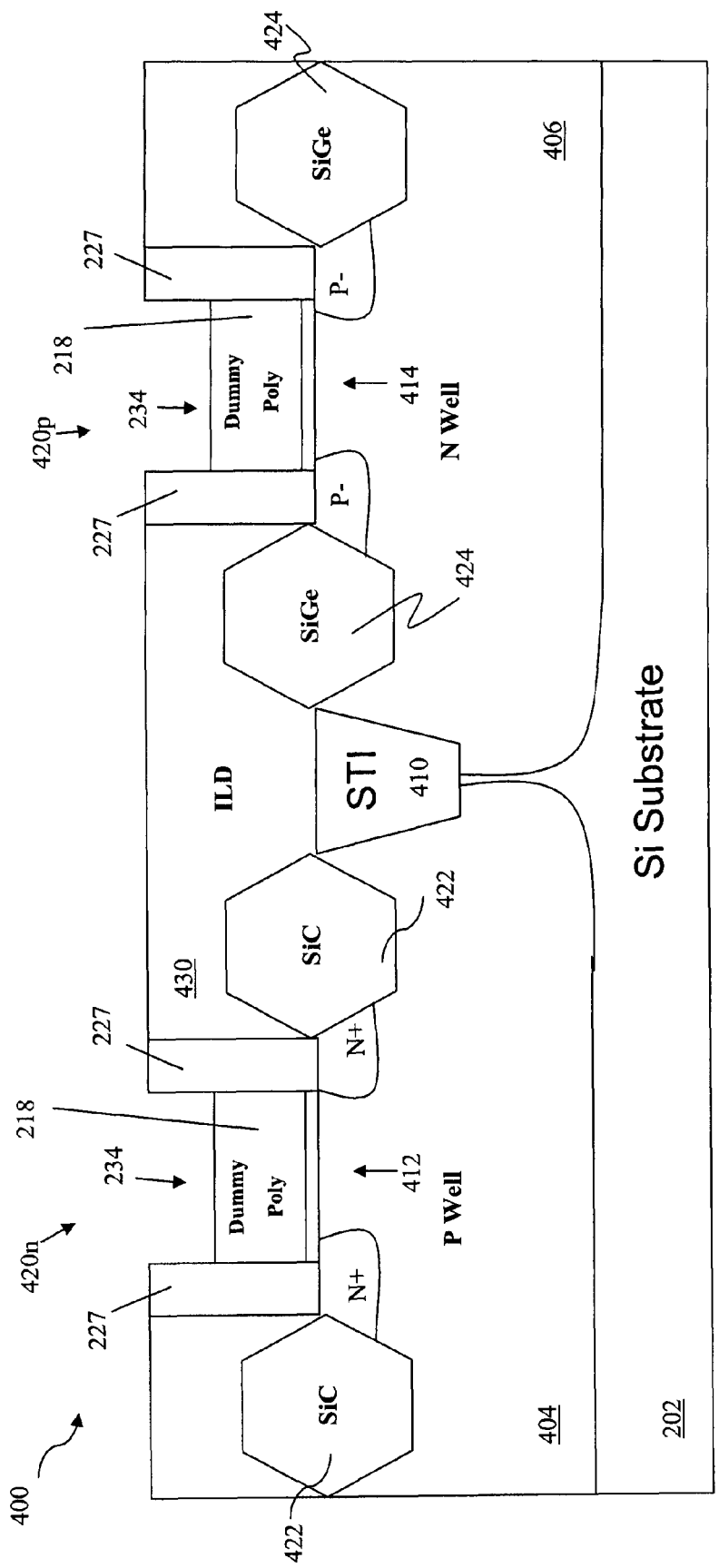

The method 300 continues with block 306 in which a portion of the dummy gates is removed from the gate structures thereby forming partial trenches in the gate structures. In FIG. 4C, a patterned photoresist layer (not shown) may be formed on the device 400 to protect a portion of the device 400, such as one of the gate structures. The patterned photoresist layer may be formed by photolithography, immersion lithography, ion-beam writing, or other suitable techniques. For example, the photolithography process may include spin-coating, soft-baking, exposure, post-baking, developing, rinsing, drying, and other suitable process. A partial amount of the dummy poly gates 218 in the gate structures may be removed by a dry etching, wet etching, or combination dry and wet etching process. For example, a wet etching process may include exposure to a hydroxide containing solution (e.g., ammonium hydroxide), de-ionized water, and/or other suitable etchant solutions. Etching the poly layer 218 may be performed using HBr, CF4, C12, O2 or HeO2 at a temperature of about 0° C.-100° C. The etching process may be stopped after a time period so that a portion (e.g., ~400 angstroms) of the dummy poly gates 218 remains. Any suitable process may be used to stop the etch process. Accordingly, a portion of the dummy poly gate 218 may be etched away, thereby forming partial trenches 234 in the gate structures. Any applied patterned photoresist layer (not shown) may be removed by stripping or other suitable process.

Figure 4D:
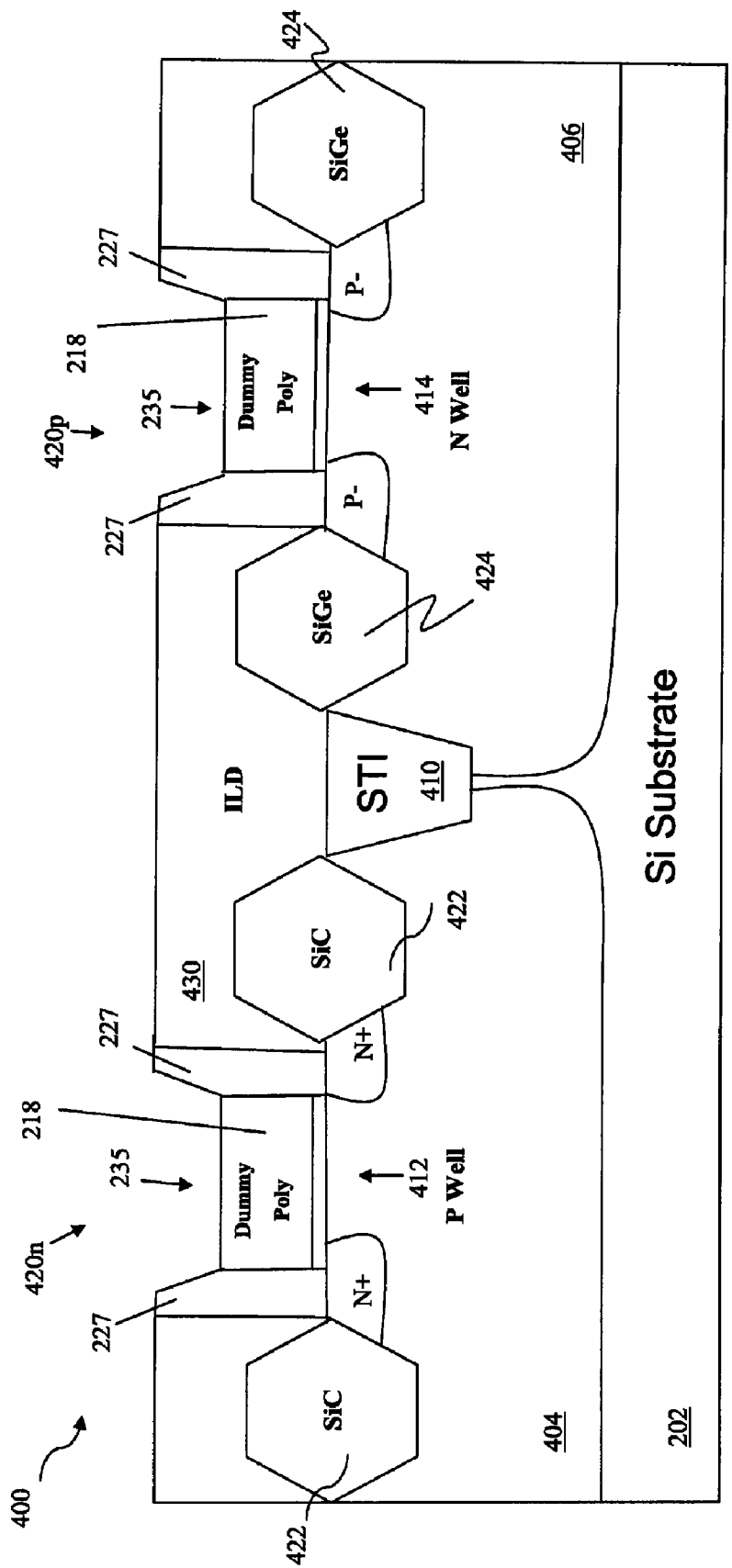

The method 300 continues with block 308 in which a portion of the spacers 227 is removed thereby forming a widened portion 235 of the partial trenches. In an embodiment, the portions of the spacers 227 are removed using a dry argon sputtering to form a funnel-shape in the trenches 235. The molecular size of the argon is appropriate for making the funnel-shape. However other elements may produce acceptable results. As shown in FIG. 4D, the argon sputtering may produce a somewhat angled side edge on the spacers 227, causing the trench to have a funnel-shaped profile. In an embodiment, this angle may extend downward approximately 100 angstroms and inward to the trench 235. In an embodiment, the remaining gate height may be approximately 400 angstroms and the gate width may be approximately 22-27 nm. However, it is contemplated that other shapes and sizes may be formed in the spacers 227 during the argon sputtering. It is to be understood that these methods may be performed on metal gate devices having a replaced polysilicon gate (RPG) using a high k last process. Additionally, other methods, such as wet etching, may be used with this system. In an embodiment, only the uppermost portion of the spacers 227 are etched, thus leaving the lower portion of the spacers intact for the device 400. The widened portion of the spacers 227 may be removed using a chemical-mechanical polishing (CMP) process, as described in more detail below. Accordingly, the enlarged trench 235 allows for better filling for the metal gate, such as in spin-on Al.

In an embodiment, this process may be performed in a single etcher PVD tool. The argon sputtering may be performed using an argon gas pressure of approximately 3-20 mTorr and at a flow rate of approximately 300-600 sccm. The argon sputtering may have a bias of approximately 200-500 Watts. In an embodiment, the argon sputtering may be performed at a temperature of approximately 0° C.-100° C. The argon sputtering may be performed for approximately 5-30 seconds.

Figure 4E:
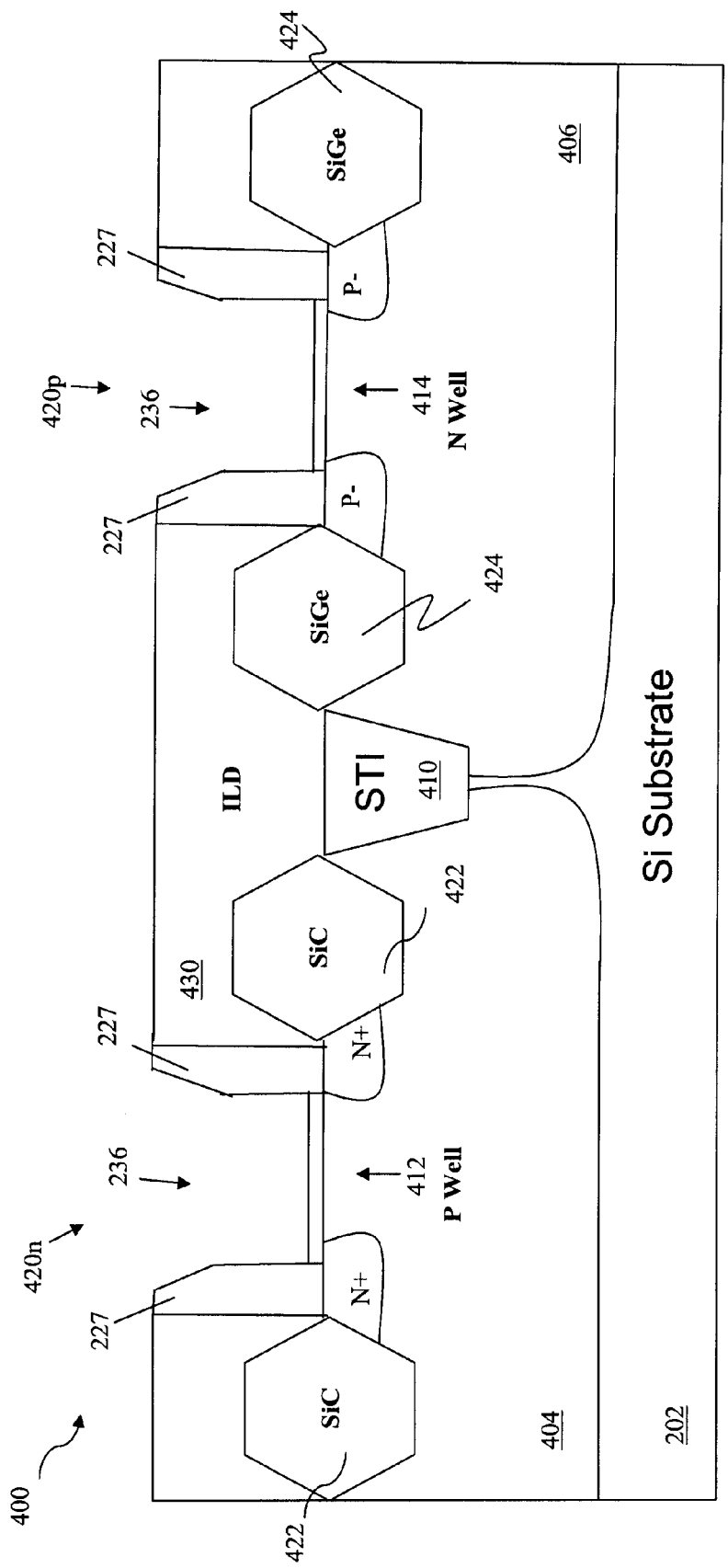

The method 300 continues with block 310 in which a remaining portion of the dummy gates is removed from the gate structures thereby forming full trenches in the gate structures. In FIG. 4E, a patterned photoresist layer (not shown) may be formed on the device 400 to protect a portion of the device 400, such as one of the gate structures. The patterned photoresist layer may be formed by photolithography, immersion lithography, ion-beam writing, or other suitable techniques. For example, the photolithography process may include spin-coating, soft-baking, exposure, post-baking, developing, rinsing, drying, and other suitable process. The remaining portion of the dummy poly gates 218 in the gate structures may be removed by a dry etching, wet etching, or combination dry and wet etching process thereby forming full trenches 236. For example, a wet etching process may include exposure to a hydroxide containing solution (e.g., ammonium hydroxide), de-ionized water, and/or other suitable etchant solutions. Etching the poly layer 218 may be performed using HBr, CF4, C12, O2 or HeO2 at a temperature of about 0° C.-100° C. Accordingly, the remaining portion of the dummy poly gate 218 may be etched away down to the interfacial layer 415 or to the substrate 202, thereby forming full trenches 236 in the gate structures. Any applied patterned photoresist layer (not shown) may be removed by stripping or other suitable process.

Figure 4F:
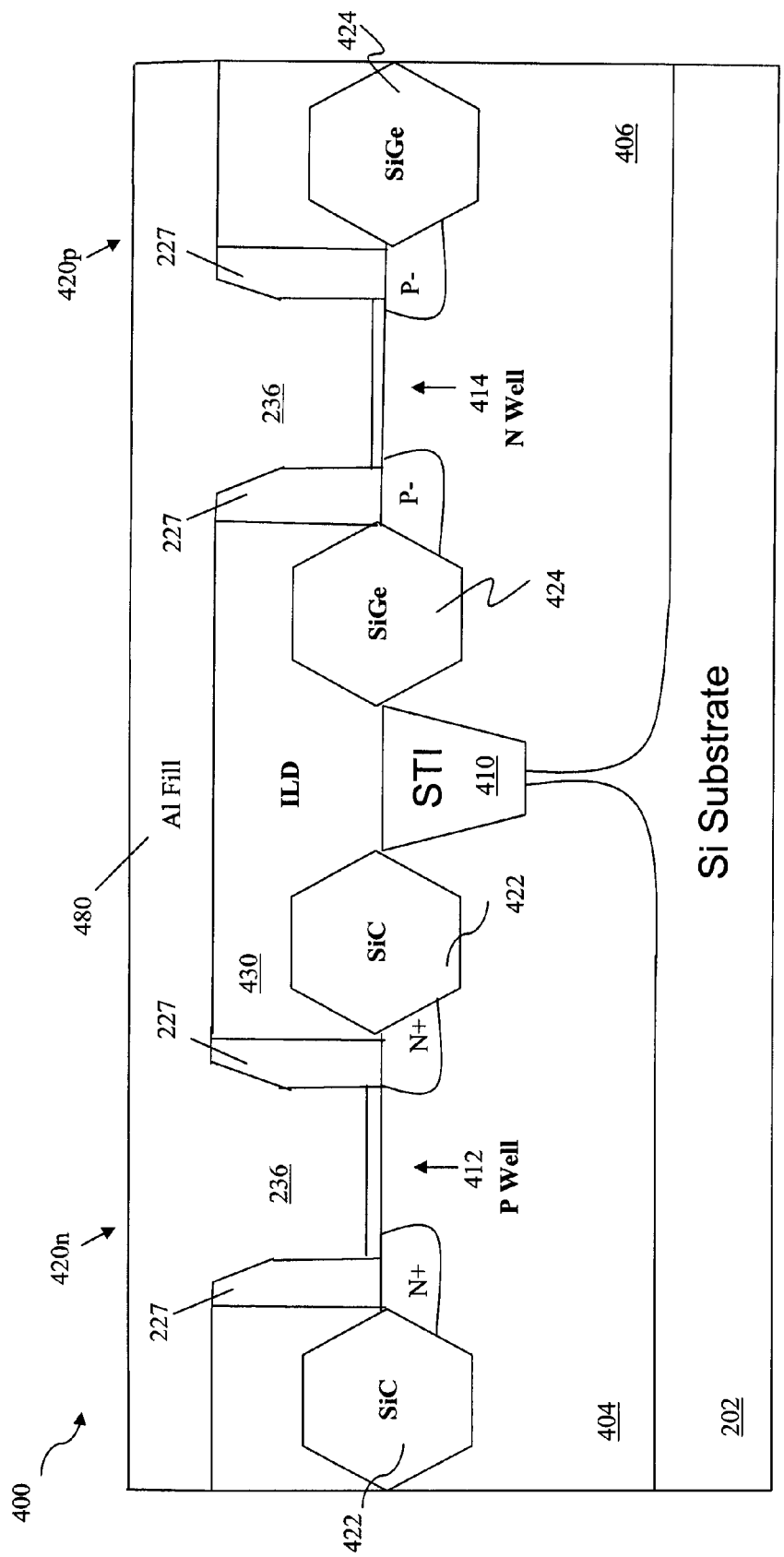

The method 300 continues with block 312 in which a high k gate film and a metal layer is formed to substantially filling in the first and second trenches. In FIG. 4F, a high k material (if not already formed on the substrate 202) may be formed on the substrate 202. Additionally, a fill metal 480 may be deposited to fill in the trenches 236. In the present embodiment, a layer of titanium (Ti) may be deposited to function as a wetting layer for a subsequent aluminum (Al) fill. The Ti layer may be formed by PVD or other suitable process. A layer of Al 480 may be formed to fill in the trenches 236. The Al layer 480 may be formed by forming a first Al layer by CVD and then forming a second Al layer by PVD. Alternatively, the fill metal 480 may optionally include tungsten (W), copper (Cu), or other suitable metal material.

Figure 4G:
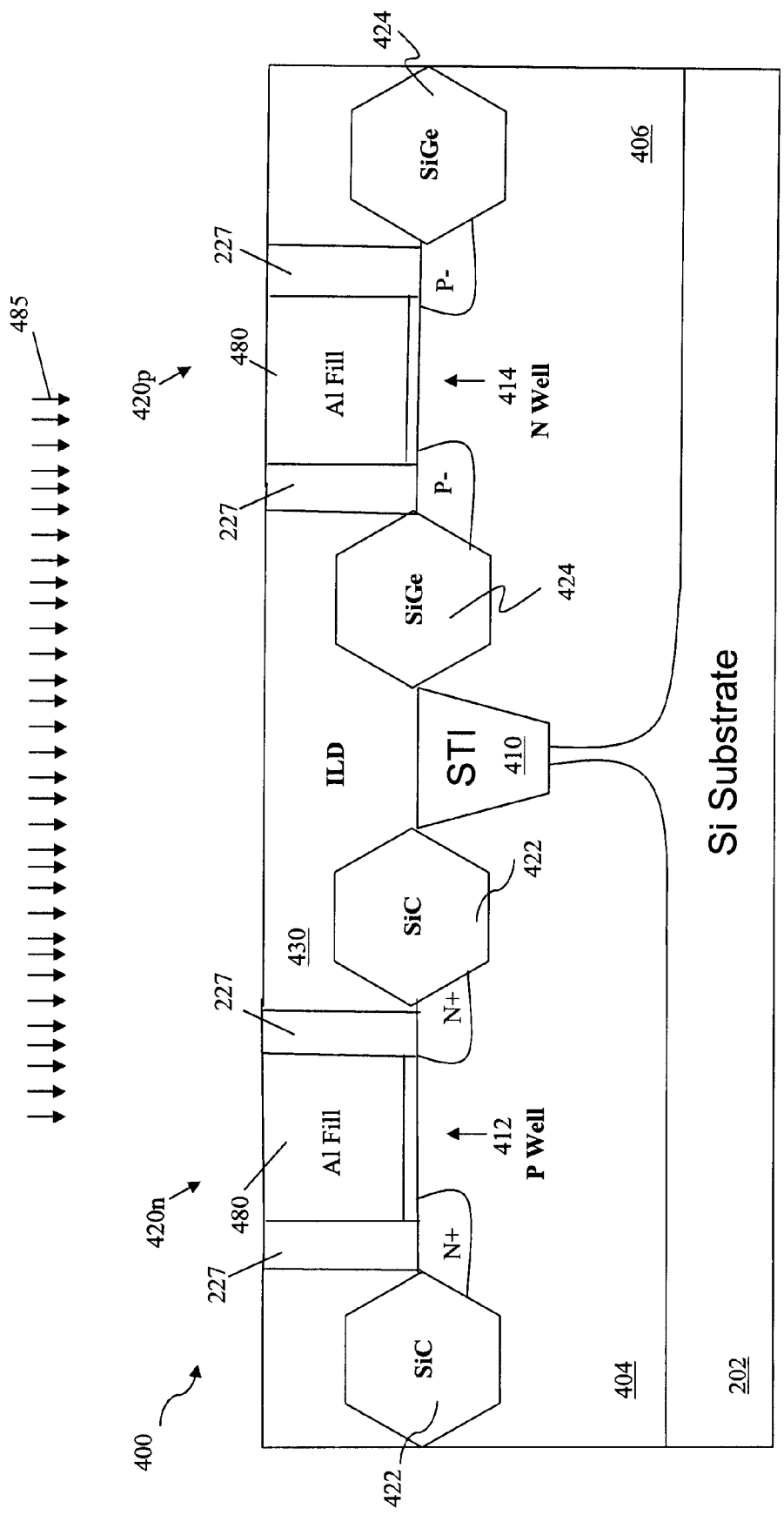

The method 300 continues with block 314 in which a chemical mechanical polishing (CMP) process is performed. In FIG. 4G, a CMP 485 may be performed on the Al layer 480 to remove the excess Al (e.g., the Al outside of the trenches 236). The CMP 485 may have a high selectivity to provide a substantially planar surface for the gate structures 420n, 420p, and ILD layer 430. Accordingly, the metal gate (including an N-metal layer (not shown) and Al fill layer 480) of the nFET 412 may perform the proper N work function and the metal gate (including a P-metal layer (not shown) and Al fill layer 480) of the pFET 414 may perform the proper P work function. Thus, the desired threshold voltages of the nFET 412 and pFET 414, respectively, may be achieved without added complexity.

It is understood that the semiconductor device 400 may undergo further processing to form various features such as contacts/vias, interconnect metal layers, interlayer dielectric, passivation layers, etc. It should be noted that the techniques and processes disclosed with reference to FIGS. 3 and 4A-4G can also be implemented in the embodiments of FIGS. 1 and 2A-2F disclosed above.

The present invention achieves different advantages in various embodiments disclosed herein. It is understood that different embodiments disclosed herein offer several different advantages, and that no particular advantage is necessarily required for all embodiments. For example, the present disclosed method provides a simple and cost-effective method for forming high-k gate dielectric in a gate last process using a dummy dielectric. As another example, the present disclosed methods provide for less voids in gate fill metal due to a larger opening when filling the gate. Moreover, the present disclosed method provides a simple and cost-effective method for forming metal gates with proper work functions for nFET and pFET devices in a gate last process. Further, the methods and devices disclosed herein may easily be integrated with current CMOS process flow and semiconductor processing equipment. For example, the methods disclosed herein implement materials and processes that are friendly and compatible with the CMOS process flow, and that are inexpensive to incorporate with the process flow.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the techniques, methodologies, and processes disclosed with reference to FIGS. 1 and 3 can also be implemented and/or combined in any of the embodiments of FIG. 1 or 3 such as lithography, etching, and high-k/metal gate formation.

What is claimed is:

1. A method of fabricating a semiconductor device comprising:
   providing a semiconductor substrate;
   forming a gate structure over the substrate, the gate structure including a first spacer, a second spacer formed apart from the first spacer, and a dummy gate between the first and second spacers;
   removing a portion of the dummy gate from the gate structure thereby forming a partial trench;
   removing a portion of the first spacer and a portion of the second spacer adjacent the partial trench thereby forming a widened portion of the partial trench;
   removing a remaining portion of the dummy gate from the gate structure thereby forming a full trench;
   forming a high k film in the full trench; and
   forming a metal gate in the full trench.

2. The method of claim 1, further comprising performing a chemical mechanical polishing (CMP) process to remove the widened portion of the partial trench after the forming of the metal gate.

3. The method of claim 1, wherein the removing a portion of the first and second spacers is performed by etching the first and second spacers.

4. The method of claim 3, wherein the etching is argon sputtering.

5. The method of claim 4, wherein the argon sputtering is performed at a pressure of about 3-20 mTorr.

6. The method of claim 4, wherein the argon sputtering is performed at an argon flow rate of about 300-600 sccm.

7. The method of claim 4, wherein the argon sputtering is performed at a bias of about 200-500 Watts.

8. The method of claim 4, wherein the argon sputtering is performed at a temperature of about 0-100° C.

9. The method of claim 4, wherein the argon sputtering is performed for about 5-30 seconds.

10. A method of fabricating a semiconductor device comprising:
    providing a semiconductor substrate;
    forming an insulator over the substrate;
    forming a first spacer over the insulator;
    forming a second spacer apart from the first spacer over the insulator;
    forming a dummy gate between the first and second spacers;
    removing a portion of the dummy gate between the first and second spacers thereby forming a partial trench;
    removing a portion of the first spacer and a portion of the second spacer adjacent the partial trench thereby forming a widened area between a portion of the first and second spacers;
    removing a remaining portion of the dummy gate thereby forming a full trench; and
    forming a metal gate in the full trench.

11. The method of claim 10, further comprising performing a chemical mechanical polishing (CMP) process to remove a portion of the metal gate formed in the widened area.

12. The method of claim 10, wherein the removing a portion of the first and second spacers is performed by etching the first and second spacers.

13. The method of claim 12, wherein the etching is argon sputtering.

14. The method of claim 13, wherein the argon sputtering is performed at a pressure of about 3-20 mTorr.

15. The method of claim 13, wherein the argon sputtering is performed at an argon flow rate of about 300-600 sccm.

16. The method of claim 13, wherein the argon sputtering is performed at a bias of about 200-500 Watts.

17. The method of claim 13, wherein the argon sputtering is performed at a temperature of about 0-100° C.

18. The method of claim 13, wherein the argon sputtering is performed for about 5-30 seconds.

19. A method of fabricating a semiconductor device comprising:
    providing a substrate having a first region and a second region;
    forming a first gate structure over the first region and a second gate structure over the second region, the first gate structure including a first spacer, a second spacer, and a first dummy gate, and the second gate structure including a third spacer, a fourth spacer, and a second dummy gate;
    removing a portion of the first dummy gate from the first gate structure thereby forming a first partial trench and removing a portion of the second dummy gate from the second gate structure thereby forming a second partial trench;
    removing a portion of the first and second spacers thereby forming a widened portion of the first partial trench and removing a portion of the third and fourth spacers thereby forming a widened portion of the second partial trench;
    removing remaining portions of the first and second dummy gates thereby forming first and second full trenches;
    forming a high k film in the first and second full trenches; and
    forming metal gates in the first and second full trenches.

20. The method of claim 19, further comprising performing a chemical mechanical polishing (CMP) process to the first, second, third and fourth spacers.

* * * * *